United States Patent [19]

Taniguchi

[11] Patent Number: 5,650,840
[45] Date of Patent: Jul. 22, 1997

[54] FOCUS DETECTING METHOD AND APPARATUS

[75] Inventor: Tetsuo Taniguchi, Kanagawa-ken, Japan

[73] Assignee: Nikon Corporation, Tokyo, Japan

[21] Appl. No.: 527,216

[22] Filed: Sep. 12, 1995

[30] Foreign Application Priority Data

Sep. 13, 1994 [JP] Japan ..................... 6-218549

[51] Int. Cl.$^6$ ........................... H01L 21/30; G03B 27/52
[52] U.S. Cl. ................ 355/55; 355/53; 250/548; 396/111; 396/116; 396/118
[58] Field of Search ................ 355/55, 53, 50; 396/117, 118, 120; 250/548; H01L 21/30

[56] References Cited

U.S. PATENT DOCUMENTS

| | | | |
|---|---|---|---|
| 3,904,869 | 9/1975 | Stauffer | 250/571 |
| 4,441,810 | 4/1984 | Momose et al. | 356/1 |
| 4,540,277 | 9/1985 | Mayes et al. | 355/53 |
| 4,629,313 | 12/1986 | Tanimoto | 355/53 |
| 4,650,983 | 3/1987 | Suwa | 250/204 |
| 4,689,480 | 8/1987 | Stern | 250/201 |
| 4,829,193 | 5/1989 | Nishi | 250/548 |
| 4,952,815 | 8/1990 | Nishi | 250/548 |
| 5,241,188 | 8/1993 | Mitzutani | 250/548 |
| 5,420,438 | 5/1995 | Sensui et al. | 250/201.8 |

*Primary Examiner*—Arthur T. Grimley
*Assistant Examiner*—Herbert V. Kerner
*Attorney, Agent, or Firm*—Armstrong, Westerman, Hattori, McLeland & Naughton

[57] ABSTRACT

A method of detecting a focus position of a projection optical system at a high throughput and with high accuracy. A sensor pattern (SP) which is provided on a wafer stage (WS) as a light-receiving part of a photoelectric sensor (PES) is moved in the direction of an optical axis (AX) of a projection optical system (PL), and at the same time, it is moved in a direction (X) perpendicular to the optical axis (AX). While doing so, a reticle pattern (RP) which is provided on a reticle (R) is illuminated by illuminating light (IL) for exposure, and an image of the reticle pattern (RP) is formed on the sensor pattern (SP) through the projection optical system (PL). Light passing through the sensor pattern (SP) is received by the photoelectric sensor (PES), and a focus position is detected on the basis of the intensity of the transmitted light.

19 Claims, 5 Drawing Sheets

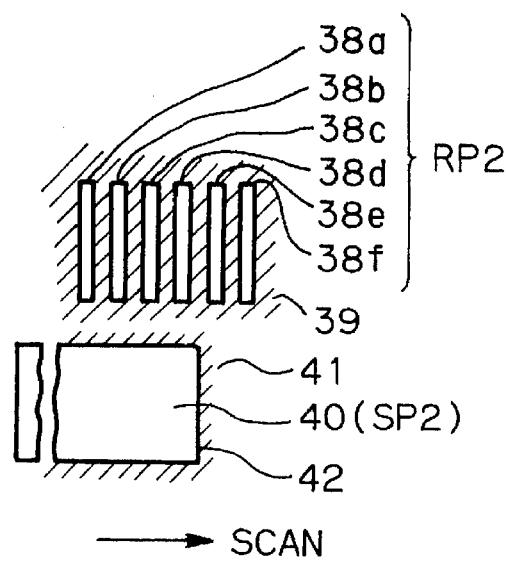
Fig. 5(a)
Fig. 5(b)
→ SCAN
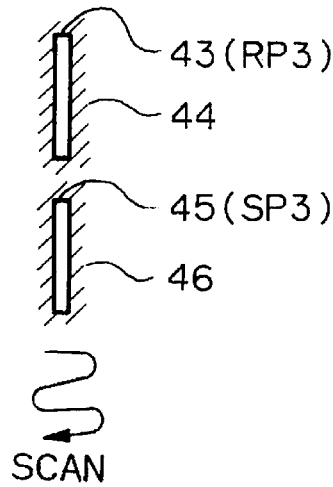
Fig. 6(a)
Fig. 6(b)
SCAN
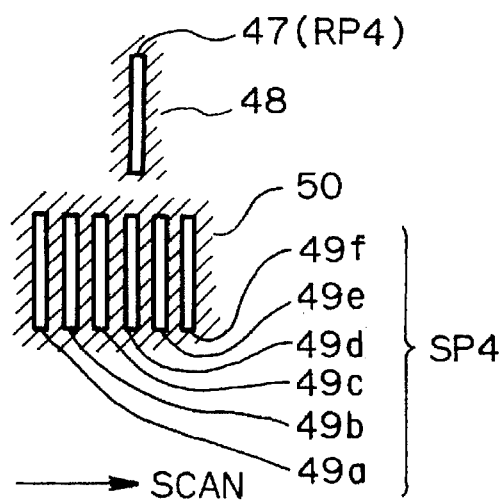
Fig. 7(a)
Fig. 7(b)
→ SCAN

FOCUS DETECTING METHOD AND APPARATUS

BACKGROUND OF THE INVENTION

1. Field of the Invention

The present invention relates to a method of detecting a focus of a projection optical system. More particularly, the present invention relates to a focus detecting method which may be suitably applied to the detection of a focus position of a projection optical system which is attached to a projection exposure apparatus used to produce a semiconductor integrated circuit, a liquid crystal panel, an imaging device (CCD), a thin-film magnetic head, or a magneto-optical disc.

2. Description of the Related Art

A projection exposure apparatus which is used to produce a semiconductor integrated circuit or a liquid crystal panel, for example, needs to strictly align a photosensitive substrate with the imagery position (focus position) of a projection optical system. To comply with the need, there have heretofore been proposed various methods in which an image of a mask pattern is received with a photoelectric sensor, and a focus position is obtained on the basis of an output signal from the photoelectric sensor.

The conventional methods may be roughly classified into two types. The first type of conventional focus position detecting method will be explained below with reference to FIGS. 9(a) and 9(b).

FIGS. 9(a) and 9(b) show one example of conventional focus position detecting methods. FIG. 9(a) schematically shows the arrangement of a projection exposure apparatus, and FIG. 9(b) is a graph showing the waveform of an output signal from a photoelectric detector (photoelectric sensor). As shown in FIG. 9(a), a reticle R1, which serves as a mask, has a pattern (reticle pattern) RPA having a light-transmitting portion. The reticle pattern RPA is illuminated with a bundle of illuminating light rays IL1 from an illumination system (not shown). An image of the pattern RPA is projected through a projection optical system PL1 onto a light-transmitting sensor pattern SPA which is provided on a wafer stage WS1, on which a photosensitive substrate is mounted. A ray bundle passing through the sensor pattern SPA is incident on a photoelectric sensor PES1 which is disposed directly below the sensor pattern SPA. In this example, the constituent elements have previously been positioned so that the image of the reticle pattern RPA which is projected by the projection optical system PL1 will be superimposed on the sensor pattern SPA. In addition, the constituent elements have been designed so that the projected image of the reticle pattern RPA and the sensor pattern SPA will substantially match each other in terms of shape and size. Here, a Z-axis is taken in a direction parallel to the optical axis of the projection optical system PL1, and an X-axis is taken in a direction parallel to the plane of FIG. 9(a) within a plane perpendicular to the Z-axis. Further, a Y-axis is taken in a direction perpendicular to the plane of FIG. 9(a).

In the above-described arrangement, if an output signal I from the photoelectric sensor PES1 is monitored with the wafer stage WS1 moved in the optical axis direction (Z-axis direction) of the projection optical system PL1, an output that is shown by the curve L1 in FIG. 9(b) is obtained. It should be noted that, in FIG. 9(b), the abscissa axis represents the position z in the direction Z, and the ordinate axis represents the output signal I of the photoelectric sensor PES1. When the projected image of the reticle pattern RPA and the sensor pattern SPA come into imagery relation to each other, that is, when the sensor pattern SPA comes at the focus position, almost all the ray bundle passing through the reticle pattern RPA passes through the sensor pattern SPA, and thus the output signal I of the photoelectric sensor PES1 reaches a maximum. As the distance from the focus position increases, the image of the reticle pattern RPA spreads on the sensor pattern SPA, resulting in a decrease in the quantity of light passing through the sensor pattern SPA. Accordingly, the output signal I from the photoelectric sensor PES1 decreases. Thus, the position BF1 in the optical direction of the sensor pattern SPA at which the output signal I reaches a maximum is detected as being a focus position.

The second type of conventional focus position detecting method is disclosed, for example, in U.S. Pat. No. 4,629,313, or Japanese Patent Unexamined Publication (KOKAI) No. 4-211110. The second method will be explained below with reference to FIGS. 10(a) to 10(e).

FIGS. 10(a) to 10(e) show another example of conventional focus position detecting methods. FIG. 10(a) schematically shows the arrangement of a projection exposure apparatus. FIGS. 10(b) to 10(d) respectively show the waveforms of outputs signals from a photoelectric sensor which are obtained when the position of the wafer stage WS1 in the optical axis direction is at three different points $z_1$, $z_2$ and $z_3$. The projection exposure apparatus shown in FIG. 10(a) has an arrangement approximately similar to that of the projection exposure apparatus shown in FIG. 9(a). However, the arrangement in FIG. 10(a) differs from the arrangement in FIG. 9(a) in that the wafer stage WS1 is moved not in the direction Z but in a direction (direction X) which is perpendicular to the optical axis of the projection optical system PL1, and which is parallel to the plane of FIG. 10(a), and while doing so, the output signal I of the photoelectric sensor PES1 is monitored, and this operation is repeated with the position of the wafer stage WS1 in the optical axis direction varied to carry out measurement, thereby detecting a focus position. It should be noted that, in FIGS. 10(b) to 10(d), the abscissa axis represents the position x in the direction X, and the ordinate axis represents the output signal I of the photoelectric sensor PES1.

As shown in FIGS. 10(b) to 10(d), at the positions $z_1$ and $z_3$ in the direction Z, the deviation from the focus position is relatively large, and the image of the reticle pattern RPA is out of the focus position. Therefore, the waveform of the output signal I is relatively gentle, as shown by the curves L2 and L4. On the other hand, the position $z_2$ in the direction Z is close to the focus position, and the image of the reticle pattern RPA is therefore sharp at the position $z_2$. Accordingly, the waveform of the output signal I draws a curve of good contrast, as shown in by the curve L3 in FIG. 10(c). Differences between the maximum and minimum values of the output signals in FIGS. 10(b) to 10(d) are assumed to be $C_1$ to $C_3$, respectively.

FIG. 10(e) is a graph showing the relationship between the position z in the optical axis direction and the differences $C_1$ to $C_3$ defined as contrast C. The abscissa axis represents the position z in the direction Z, and the ordinate axis represents the contrast C. As shown by the curve L5 in FIG. 10(e), the contrast C draws a gentle curve which reaches a maximum at the position BF2 in the direction Z. In this case, the position BF2 at which the contrast is the highest is detected as being a focus position. It should be noted that there is another method in which comparison is made in terms of the angle at which each of the curves L2 to L4 rises in place of the contrast $C_1$ to $C_3$.

The above-described first method suffers, however, from some problems described below. If the image of the reticle pattern RPA is not closely superimposed on the sensor pattern SPA, the quantity of light entering the photoelectric sensor PES1 decreases, and thus the SN ratio of the signal deteriorates. Consequently, the reproducibility of detection of the focus position becomes degraded. In general, the signal becomes more sensitive as the reticle pattern or the sensor pattern becomes thinner, and moreover, it is desirable for the reticle pattern to have the same line width as that of the actual circuit pattern. For this reason, the reticle pattern is generally designed to have a small size which is close to the resolution of the projection optical system. More specifically, in an exposure apparatus for a semiconductor integrated circuit, for example, the line width of the reticle pattern is generally not larger than 1 µm. Therefore, even if the pattern alignment has been strictly effected, the pattern position shifts with passage of time owing to the drift of the apparatus or other reason. Further, replacement of the reticle also causes the pattern position to shift because of errors in the reticle positioning accuracy or the pattern drawing accuracy. Therefore, pattern alignment is needed almost every time detection of a focus position is carried out. Accordingly, it takes a great deal of time to detect a focus position, causing the throughput (productivity) of the exposure process to be deteriorated.

In general, alignment is carried out by a method in which the light-receiving part of a photoelectric sensor is moved in a plane perpendicular to the projection optical system to search for a point at which the output of the photoelectric sensor reaches a maximum. Since the alignment is carried out before the detection of a focus position, the light-receiving part of the photoelectric sensor is not necessarily coincident with the image-forming plane. When the light-receiving part of the photoelectric sensor does not coincide with the image-forming plane, the image of the reticle pattern is not sharp, and the focus position cannot accurately be obtained.

In the second method, no strict alignment is required before the detection of a focus position, but it is necessary to effect scanning many times with the position of the wafer stage WS1 changed in the direction Z. Accordingly, the second method suffers from the problem that the throughput deteriorates.

In recent years, circuit patterns have become increasingly small and fine, and it has become necessary to align the photosensitive substrate with the focus position (i.e., to effect focusing) with a higher degree of accuracy. Projection exposure apparatuses have heretofore been adapted to automatically correct the focus position by arithmetically predicting a change of the focus position which may be caused, for example, by a change in the atmospheric pressure, absorption of exposure light by the projection optical system, or a change in the illumination method (e.g., a change of σ value, which is a coherence factor, annular illumination, etc.). However, it is also necessary in order to effect even more strict focusing to detect a focus position by actual measurement. With the achievement of fine circuit patterns, the focus detecting operation by actual measurement must be carried out more frequently than in the past. Therefore, it is impossible to meet the demand with a focus position detecting method of low measuring efficiency.

An object of the present invention is to provide a method of detecting a focus of a projection optical system, which requires no strict alignment, and which enables a reduction in the time required for measurement.

SUMMARY OF THE INVENTION

The present invention provides a method of detecting a focus position of a projection optical system which projects an image of a pattern on a first surface onto a second surface. The method employs a pattern for detection which is disposed on one of the first and second surfaces, and a photoelectric detector having a light-receiving part of predetermined configuration which is disposed on the other of the first and second surfaces. With the pattern for detection illuminated, the pattern for detection and the light-receiving part of the photoelectric detector are moved relative to each other in a direction parallel to an optical axis of the projection optical system, and at the same time, the pattern for detection and the light-receiving part of the photoelectric detector are moved relative to each other in a direction (direction X) perpendicular to the optical axis. An output signal from the photoelectric detector which is obtained when the light-receiving part crosses a bundle of light rays forming an image of the pattern for detection is taken in, and a focus position of the projection optical system is obtained on the basis of the output signal thus taken in.

In this case, the pattern for detection and the light-receiving part of the photoelectric detector may be moved in such a manner that either one of the two is moved parallel to the optical axis, and at the same time, the other is moved in a direction perpendicular to the optical axis.

One example of the pattern for detection is one or a plurality of slit-shaped patterns arranged in a predetermined direction (direction X), as shown in FIG. 5(a). One example of the light-receiving part of the photoelectric detector, which corresponds to the above pattern for detection, has an edge extending in a direction (direction Y) perpendicular to the predetermined direction, as shown in FIG. 5(b).

Further, when the projection optical system is used to project an image of a mask pattern illuminated by an illumination optical system onto a photosensitive substrate, the pattern for detection may be disposed on the mask pattern side and illuminated by the illumination optical system.

According to the above-described focus detecting method of the present invention, the pattern for detection and the light-receiving part of the photoelectric detector are moved relative to each other in a direction perpendicular to the optical axis of the projection optical system, and at the same time, they are moved relative to each other in the optical axis direction, thereby detecting a focus position. Accordingly, alignment in a plane perpendicular to the optical axis of the projection optical system need not be so strict as in the first type of conventional method, but it is only necessary that there should be a position at which the image of the pattern for detection and the light-receiving part of the photoelectric detector coincide with each other in the range within which the two elements move in the direction X during the detection of a focus position, provided that the position in the direction Y is accurate. Accordingly, it is not necessary to effect alignment strictly every time the detection of a focus position is carried out. Thus, the detection of a focus position can be rapidly effected.

Further, since there is no need for repeated movement in a plane perpendicular to the projection optical system as is needed in the second type of conventional method, the time required for measurement can be shortened.

In a case where either the pattern for detection or the light-receiving part of the photoelectric detector is moved parallel to the optical axis, and at the same time, the other is moved in a direction perpendicular to the optical axis, the control operation is facilitated because the pattern for detection and the light-receiving part are each moved only in one direction.

In a case where the pattern for detection is one or a plurality of slit-shaped patterns arranged in a predetermined direction (direction X), and the light-receiving part of the photoelectric detector, which corresponds to the above pattern for detection, is a pattern having an edge which extends in a direction (direction Y) perpendicular to the predetermined direction, the light-receiving area of the light-receiving part can be enlarged, and it is therefore easy to form a pattern constituting the light-receiving part. In addition, the pattern configuration of the light-receiving part of the photoelectric detector need not be changed according to the measurement line width of the pattern for detection; this is another advantage of the present invention.

Further, in a case where the projection optical system is used to project an image of a mask pattern illuminated by an illumination optical system onto a photosensitive substrate, and the pattern for detection is disposed at the mask pattern side and illuminated by the illumination optical system, there is no need for providing a special illumination system for the detection of a focus position.

BRIEF DESCRIPTION OF THE DRAWINGS

FIGS. 5(a) and 5(b) are enlarged plan views showing a reticle pattern RP2 and a sensor pattern SP2, respectively.

FIGS. 6(a) and 6(b) are enlarged plan views showing a reticle pattern RP3 and a sensor pattern SP3, respectively.

FIGS. 7(a) and 7(b) are enlarged plan views showing a reticle pattern RP4 and a sensor pattern SP4, respectively.

DETAILED DESCRIPTION OF PREFERRED EMBODIMENTS

One embodiment of the focus detecting method according to the present invention will be described below with reference to FIGS. 1 to 3(b).

Figure 1:
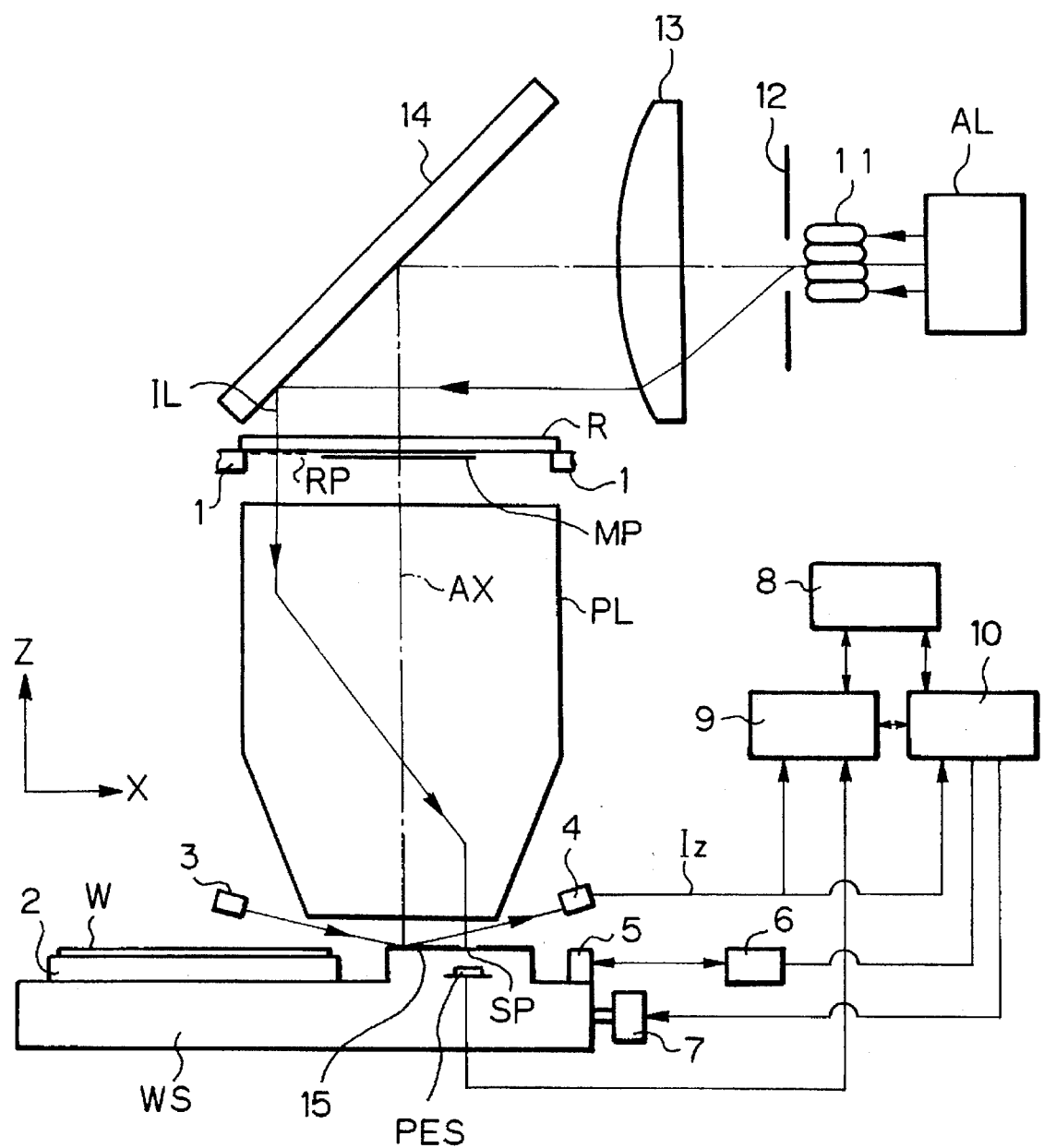
FIG. 1 shows the arrangement of a step-and-repeat projection exposure apparatus employed in one embodiment of the present invention.

FIG. 1 schematically shows the arrangement of a step-and-repeat projection exposure apparatus to which the focus detecting method of this embodiment may be suitably applied. Referring to FIG. 1, a light source system AL has a mercury-vapor lamp as a light source for exposure, an elliptic mirror, a collimator lens, an interference filter, etc. Illuminating light IL emitted from the light source system AL passes through an optical integrator (fly-eye lens) 11, an aperture stop (σ stop) 12 and a condenser lens 13 to enter a dichroic mirror 14 for bending the optical path. After being bent at approximately right angles by the dichroic mirror 14, the illuminating light IL illuminates a reticle R having a circuit pattern MP drawn thereon at an approximately uniform illuminance. As a result, an image of the circuit pattern MP on the reticle R is projected onto a wafer W through a projection optical system PL. It should be noted that the wafer W is not at the exposure position in FIG. 1 because the figure shows a state of the apparatus during the detection of a focus position.

It should be noted that, as the illuminating light IL for exposure, it is possible to use laser light, e.g., excimer laser (KrF excimer laser, ArF excimer laser, etc.), or metal vapor laser or YAG laser harmonic, in addition to emission lines from a mercury-vapor lamp or other light source. The light source system AL is further provided with a shutter for cutting off exposure light, or an illumination condition switching device for changing characteristics of light rays illuminating the reticle R, which has been disclosed in U.S. Pat. No. 5,335,044, in addition to the above-described optical elements. Further, a relay optical system (not shown) and a variable field stop (not shown) for limiting the illumination area on the reticle R are provided in front of the condenser lens 13. Here, a Z-axis is taken in a direction parallel to an optical axis AX of the projection optical system PL, and a Y-axis is taken in a direction perpendicular to the plane of FIG. 1 within a plane perpendicular to the Z-axis. Further, an X-axis is taken in a direction parallel to the plane of FIG. 1.

The reticle R is held by vacuum on a reticle stage 1 which is slightly movable in a direction (direction Z) parallel to the optical axis AX and also two-dimensionally movable and slightly rotatable in a plane (XY-plane) perpendicular to the optical axis AX by the action of a driving system (not shown). The reticle R is formed with the above-described circuit pattern MP and a reticle pattern RP for focus position detection, which is disposed at the periphery of the circuit pattern MP. Further, the position of the reticle stage 1 in each of the directions X and Y is always detected at a resolution of about 0.01 μm, for example, by a laser interferometer (not shown) which is disposed at the periphery of the reticle stage 1. The laser interferometer is disclosed in U.S. Pat. No. 5,243,195.

The wafer W is held by vacuum on a wafer holder 2 which is provided on the wafer stage WS. The wafer stage WS is movable in a plane (XY-plane) perpendicular to the optical axis AX of the projection optical system PL by the action of a driving motor 7. By moving the wafer stage WS according to the step-and-repeat method, the circuit pattern MP on the reticle R is transferred onto the wafer W by exposure. Further, the wafer stage WS has a Z-stage which is movable in the direction (direction Z) of the optical axis AX of the projection optical system PL. The Z-stage enables the wafer W to move so that the surface of the wafer W coincides with the image surface of the projection optical system PL.

In addition, a glass substrate 15 is installed on the Z-stage of the wafer stage WS at a position which is in close proximity to the wafer holder 2. The glass substrate 15 has been formed with a sensor pattern SP having a predetermined configuration to receive light passing through the reticle pattern RP and forming an image of the reticle pattern RP through the projection optical system PL. A photoelectric sensor PES for receiving the image-forming light passing through the sensor pattern SP is disposed below the sensor pattern SP.

The position of the wafer stage WS in the XY-plane is measured with high accuracy by a combination of a laser interferometer 6 which is disposed at the periphery of the wafer stage WS, and a moving mirror 5 which is provided on an end portion of the wafer stage WS so as to reflect laser light from the laser interferometer 6. It should be noted that, in FIG. 1, only the laser interferometer for the direction X is shown.

The position of the wafer W (or the sensor pattern SP) in the direction Z is measured by an oblique incidence focus position detecting system which comprises a light-projecting system 3 and a light-receiving system 4 (hereinafter, the combination of the light-projecting and -receiving systems 3 and 4 will also be referred to as "oblique incidence optical system 3 and 4"). The focus position detecting system has been disclosed in U.S. Pat. No. 4,650,983. Light rays emitted from the light-projecting system 3 are those in a wavelength band in which the photosensitive material on the wafer W will not be affected by exposure light. The light rays are projected onto the wafer W obliquely to the optical axis AX in the form of a pinhole or slit image. The light-receiving system 4 has been designed so that when the surface of the wafer W coincides with the image surface of the projection optical system PL, the position of the reflected image from the wafer W coincides with a pinhole or slit provided inside the light-receiving system 4. A signal $I_z$ from the light-receiving system 4 which corresponds to the position of the wafer W in the direction Z is sent to a stage controller 10. The stage controller 10 controls the Z-stage so that the surface of the wafer W coincides with the image surface on the basis of the signal $I_z$. Further, a plane-parallel plate (not shown) for shifting light rays is provided inside the light-receiving system 4. The angle of the plane-parallel plate is adjusted so that the reflected light from the wafer W always coincides with the pinhole or slit at the image surface of the light-receiving system 4 even if the image surface of the projection optical system PL varies.

The oblique incidence optical system 3 and 4 is one example of a sensor for detection in the direction Z. There are other systems having the same function as that of the oblique incidence optical system 3 and 4, for example, a system in which the position of reflected slit image-forming light is detected by a line sensor. Such a system may also be used for measurement. The projection exposure apparatus in this embodiment is provided with a mechanism for alignment and other mechanisms in addition to the above-described mechanisms. However, since such mechanisms are not directly related to this embodiment, description thereof is herein omitted.

Next, the mechanism for detecting a focus position of the projection optical system PL in this embodiment will be explained in detail.

As has been described above, the reticle pattern RP for focus position detection is provided at the periphery of the circuit pattern MP on the reticle R. The reticle pattern RP is usually provided, for example, in a street line around or inside the circuit pattern MP so that the reticle pattern RP will not interfere with the essential circuit pattern MP. Further, the sensor pattern SP having a predetermined configuration is formed on the wafer stage WS, and the photoelectric sensor PES, which receives a bundle of light rays passing through the sensor pattern SP, is provided below the sensor pattern SP, as described above. The sensor pattern SP may be regarded as being a light-receiving part of the photoelectric sensor PES.

Figure 3A:
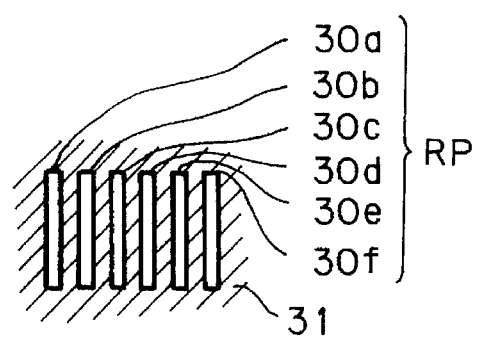
FIGS. 3(a) and 3(b) are enlarged plan views showing a reticle pattern RP and a sensor pattern SP, respectively.
Figure 3B:
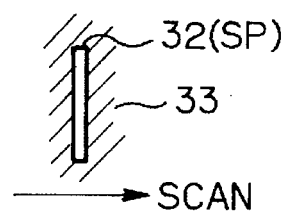

FIG. 3(a) shows the reticle pattern RP on the reticle R, and FIG. 3(b) shows the sensor pattern SP on the wafer stage WS. As shown in FIG. 3(a), the reticle pattern RP is a line-and-space pattern comprising a plurality of slit-shaped light-transmitting portions $30a$ to $30f$ which are formed in a light-blocking area 31. The light-transmitting portions $30a$ to $30f$ are arranged at equal spaces in the direction of scan, which is performed during the detection of a focus position, and elongate in a direction perpendicular to the scan direction. As has been described above, it is preferable for the line-and-space pattern to be as thin as possible when the detecting resolution is taken into consideration. Moreover, as the dimension of the line-and-space pattern becomes closer to the dimension of the actual circuit pattern MP, the optical path in the projection optical system PL of diffracted light from the circuit pattern MP and that of diffracted light from the reticle pattern RP coincide with each other more accurately, and thus the detection is less affected by the optical path difference in the projection optical system PL between the circuit pattern MP and the reticle pattern RP. Accordingly, the space between each pair of adjacent slit-shaped light-transmitting portions of the reticle pattern RP is set as close to the resolution of the projection optical system PL as possible. The image of the reticle pattern RP is formed on the sensor pattern SP, which is provided on the wafer stage WS, through the projection optical system PL.

As shown in FIG. 3(b), the sensor pattern SP is a single slit-shaped light-transmitting portion 32 which is formed in a light-blocking area 33 so as to be elongate in a direction perpendicular to the scan direction. The sensor pattern SP is usually designed to be approximately equal in size to the image of the reticle pattern RP which is projected onto the sensor pattern SP. The photoelectric sensor PES is provided below the sensor pattern SP. Thus, light rays passing through the sensor pattern SP are received by the photoelectric sensor PES.

It should be noted that a condenser lens may be provided between the sensor pattern SP and the photoelectric sensor PES. Further, when there is no sufficient space for installing a photoelectric sensor on the wafer stage WS, the arrangement may be such that the sensor pattern SP alone is provided on the wafer stage WS, and light passing through the sensor pattern SP is led to a photoelectric sensor provided in another place (outside the wafer stage WS) through an optical fiber bundle or the like.

An output signal I from the photoelectric sensor PES is sent to a focus position detecting system 9, shown in FIG. 1, together with the output signal $I_z$ from the light-receiving system 4, and subjected to arithmetic processing in a unit (CPU) provided in the focus position detecting system 9. On the basis of the result of the arithmetic processing, a focus position is detected. It should be noted that both the focus position detecting system 9 and the stage controller 10 are controlled by a main control system 8.

Next, an example of a focus position detecting operation in this embodiment will be explained.

First, in FIG. 1, the wafer stage WS is moved to a measurement start point on the basis of a command from the stage controller 10. A scanning start and end points in the direction Z of the wafer stage WS are determined so that all the projected image of the reticle pattern RP passes through the area of the sensor pattern SP during the measurement, and that the center of the scanning range in the direction Z coincides with the design focus position of the projection lens by using the laser interferometers 6, which measure the position of the wafer stage WS in the directions X and Y, and the oblique incidence optical system 3 and 4, which measures the position of the wafer stage WS in the direction Z. Then, the wafer stage WS is moved in the direction Z. It should be noted that since the oblique incidence optical system 3 and 4, which performs measurement in the direction Z, is adapted to detect the center of the optical axis of the projection optical system PL, if the surface of the sensor pattern SP is not parallel to the XY-plane, a difference in height is produced between the light-receiving position of the sensor pattern SP and the position of the wafer W at the point of detection by the oblique incidence optical system 3 and 4 in the direction Z. Therefore, the positional difference in the direction Z between the two points has previously been measured by the oblique incidence optical system 3 and 4, and a focus position is obtained from the result of the measurement by taking the difference into consideration.

After the wafer stage WS has reached the measurement start point, the shutter which has been closed to cut off illuminating light for exposure is opened, thereby illuminating the reticle pattern RP with illuminating light IL for circuit pattern exposure. At this time, it is desirable to limit the exposure range by the variable field stop so that no light rays will pass through a region other than the reticle pattern RP and unnecessarily strike on and heat the wafer stage WS or the projection optical system PL. After the shutter has been opened, the wafer stage WS is moved in the direction X and, at the same time, the wafer stage WS (Z-stage) is moved in the direction Z on the basis of a command from the stage controller 10. At this time, the output signal I from the photoelectric sensor PES and the output signal $I_s$ from the light-receiving system 4 are sent in parallel to the focus position detecting system 9.

Figure 2:
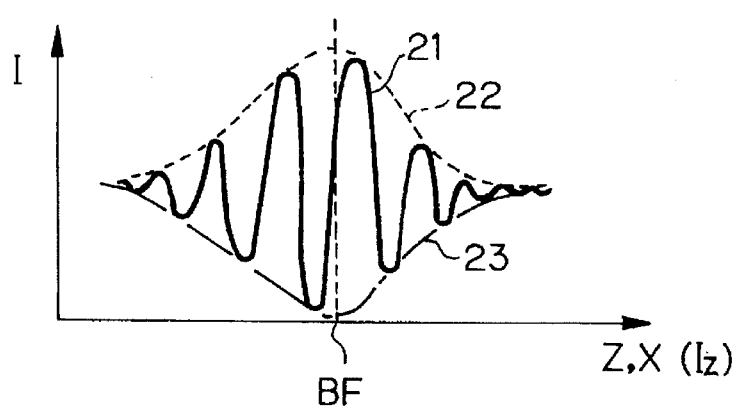
FIG. 2 is a graph showing the waveform of an output signal from a photoelectric sensor in the apparatus shown in FIG. 1.

FIG. 2 shows the waveform of the output signal I from the photoelectric sensor PES. The abscissa axis represents the position x in the direction X and the position z in the direction Z of the sensor pattern SP, and the ordinate axis represents the output signal I. In FIG. 2, the solid-line curve 21 shows the output signal I from the photoelectric sensor PES. As the wafer stage WS comes toward the focus position, the amplitude of the waveform of the output signal I increases, whereas, as the wafer stage WS comes away from the focus position, the amplitude of the output signal I decreases and converges to zero.

The broken-line curve 22 shows the output signal I obtained when the sensor pattern SP moves in the direction Z with the image of a light-transmitting portion of the reticle pattern RP kept coincident with the light-transmitting portion 32 of the sensor pattern SP (i.e., without the light-transmitting portion image and the light-transmitting portion 32 moving in the direction X). The curve 22 draws the same waveform that is shown in FIG. 9(b), which has been explained in connection with the conventional technique. The curve 23 shown by the one-dot chain line shows the output signal I obtained when the sensor pattern SP moves in the direction Z when the projected image of the light-blocking portion 31 between a pair of adjacent light-transmitting portions of the reticle pattern RP is kept coincident with the sensor pattern SP. In this case, when the image of the reticle pattern RP lies at the focus position, no light reaches the photoelectric sensor PES because of the presence of the light-blocking portion. However, as the image of the reticle pattern RP comes away from the focus position, the image spreads. Therefore, light begins to leak from the periphery of the light-blocking portion, and thus the quantity of light passing through the sensor pattern SP increases. The curves 22 and 23 are estimated by the focus position detecting system 9, for example, from envelopes connecting the peak points of the output signal I, and a point at which the difference between the curves 22 and 23 reaches a maximum is determined as a focus position BF. At this time, the focus position detecting system 9 subjects the peak points of the output signal I to statistical processing (e.g., least square approximation), thereby approximately obtaining functions expressing the envelopes (curves 22 and 23). Then, a point at which the difference between the curves 22 and 23 reaches a maximum is calculated on the basis of the two approximate functions, and the calculated point is determined as a focus position BF.

The wafer stage WS (Z-stage) is controlled by the stage controller 10 using the oblique incidence optical system 3 and 4 so that the surface of the wafer W comes at the focus position BF obtained as described above. It should be noted that when a predetermined offset occurs with respect to the measured value BF owing to the thickness of the photosensitive material, characteristics thereof, etc., or when an offset (deviation in the direction Z) is produced between a plane on which the projected image of the oblique incidence optical system 3 and 4 is formed and a plane which is to be aligned with the focus position because of a step on the wafer (shot region) W, the wafer stage WS is controlled so that the surface of the wafer W comes to a position determined by taking the offset into consideration, for example, by giving an optical or electrical offset to the oblique incidence optical system 3 and 4.

Figure 9A:
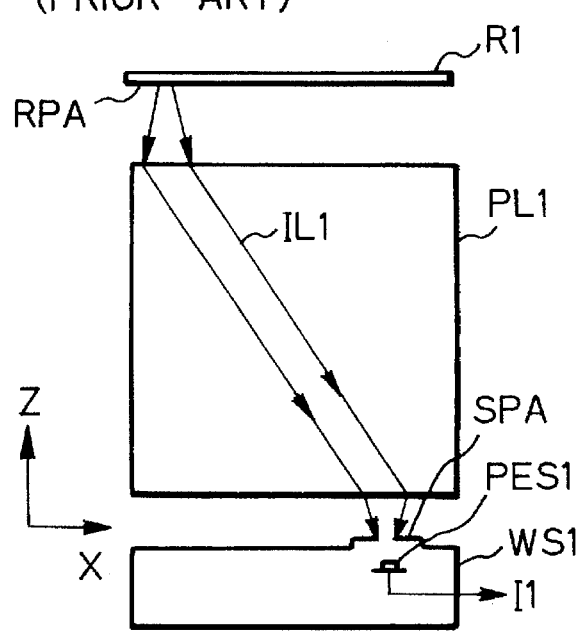
FIG. 9(a) shows the arrangement of an apparatus used to explain a conventional focus detecting method.
Figure 9B:
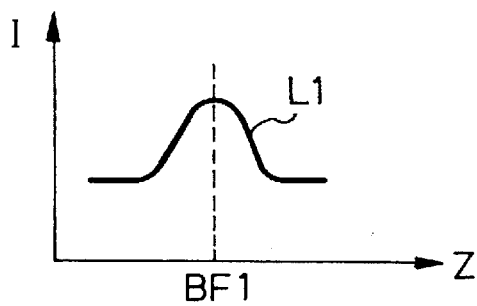
FIG. 9(b) is a graph showing the waveform of an output signal from a photoelectric sensor obtained by using the apparatus shown in FIG. 9(a).
Figure 10A:
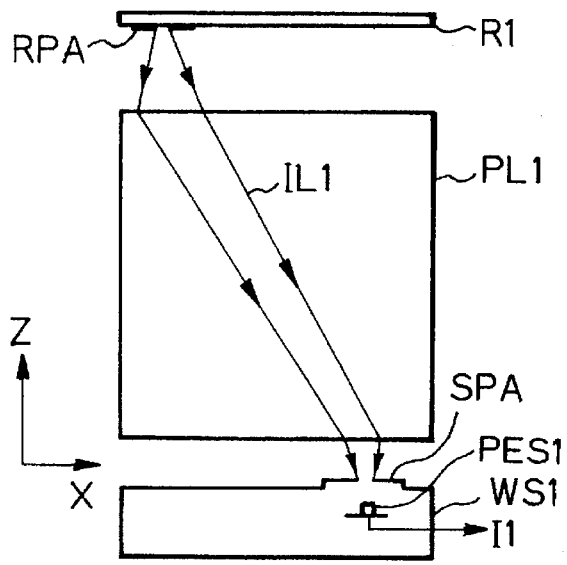
FIG. 10(a) shows the arrangement of an apparatus used to explain another conventional focus detecting method.
Figure 10B:
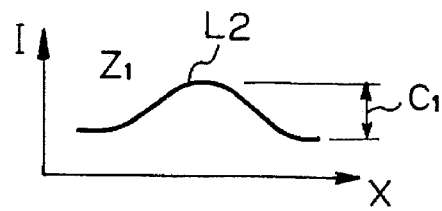
FIGS. 10(b) to 10(d) are graphs each showing the waveform of an output signal from a photoelectric sensor obtained by using the apparatus shown in FIG. 10(a).
Figure 10C:
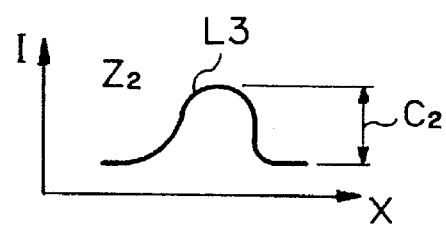
Figure 10D:
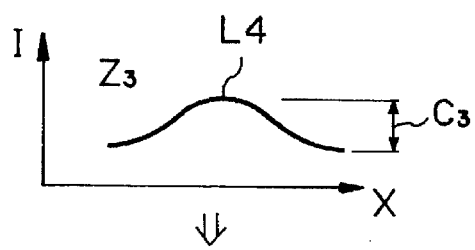
Figure 10E:
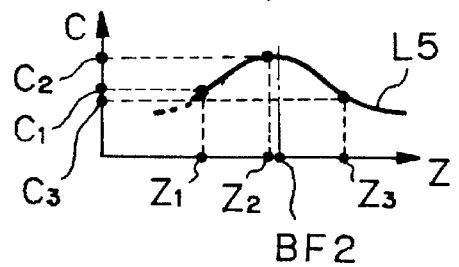
FIG. 10(e) is a graph showing the relationship between the position z in the optical axis direction and the difference of the maximum and minimum values of each of the output signals shown in FIGS. 10(b) to 10(d).

As will be clear from FIG. 2, the method of this embodiment makes it possible to obtain a signal which has a high rate of change and a favorable SN ratio in comparison to the first conventional method (the method shown in FIGS. 9(a) and 9(b)), without requiring strict alignment in the direction X. This is one of advantages obtained by the method of this embodiment. In comparison to the second conventional method, shown in FIGS. 10(a) to 10(e), the contrasts $C_1$, $C_2$ and $C_3$ at the respective points in the second conventional method match the differences between the curves 22 and 23 in FIG. 2 at the positions $z_1$, $z_2$ and $z_3$ in the optical axis direction (direction Z). That is, when the method of this embodiment and the second conventional method are compared to each other, signals obtained by the two methods are the same in terms of the rate of change. In addition, the method of this embodiment makes it possible to obtain information which is equivalent to that shown in FIG. 10(e), which is obtained by the second conventional method, by a single scan.

Although in this embodiment exposure light for a circuit pattern is used as the illuminating light IL, and a light-transmitting pattern is used as the reticle pattern RP, it should be noted that a reflecting pattern may also be used as the reticle pattern RP. In such a case, as shown, for example, in U.S. Pat. No. 5,241,188, illuminating light for exposure is led to the wafer stage (WS) side by a light guide or the like to illuminate the reticle pattern RP through the sensor pattern SP and the projection optical system PL, and reflected light from the reticle pattern RP is focused on the sensor pattern SP through the projection optical system PL. Then, a bundle of light rays passing through the sensor pattern SP is received with the photo-electric sensor PES to obtain a focus position.

Although a basic method of this embodiment has been described above, when it is desired to obtain a focus position even more accurately, it is possible to employ a method in which the above-described measurement is carried out a plurality of times, and an average of the measured data is determined to obtain a focus position. It is also possible to employ a method in which data is sampled in more detail only in the vicinity of the focus position BF. More specifically, the speed of movement of the wafer stage WS in the direction Z is slowed down in the neighborhood of the focus position BF, and data sampling intervals in the direction Z are reduced, thereby sampling data at a higher density.

Further, since the travel in the direction X is very small, it can be ignored in the actual practice. However, in a case where there may be an error in measurement by the oblique incidence optical system 3 and 4, which carries out measurement in the direction Z during the movement, due to inclination of the sensor pattern SP with respect to the XY-plane, it is preferable to previously measure a difference in height between the light-receiving position of the sensor pattern SP and the position of the wafer W at the point of detection by the oblique incidence optical system 3 and 4 by the oblique incidence optical system 3 and 4 and to correct the error in measurement.

It is also possible to prepare a reticle pattern RP adapted for a plurality of directions by taking into consideration a difference (astigmatism) in focus position which may occur according to the pattern direction. The arrangement may also be such that a plurality of reticle patterns RP are provided on the reticle R, and an average image surface is obtained on the basis of results of measurement carried out at a plurality of points in the entire exposure area on the reticle R, and then the wafer stage WS is controlled so that the surface of the wafer W coincides with the average image surface. For such an arrangement, it is preferable to use, for example, a special reticle for image surface measurement which has reticle patterns RP over the entire area thereof. It is also possible to provide a plurality of detecting devices each comprising a combination of a sensor pattern SP and a photoelectric sensor PES, and to measure an image surface by using the plurality of detecting devices at the same time.

Next, other examples of the combination of a reticle pattern RP and a sensor pattern SP will be explained with reference to FIGS. 4(a) to 7(b). It should be noted that in the following examples, the size of slit-shaped marks constituting reticle and sensor patterns or the space between each pair of adjacent slit-shaped marks are set as close to the resolution of the projection optical system PL as possible, in the same way as in the case of the relationship between the above-described reticle pattern RP and sensor pattern SP, which are shown in FIGS. 3(a) and 3(b).

Figure 4A:
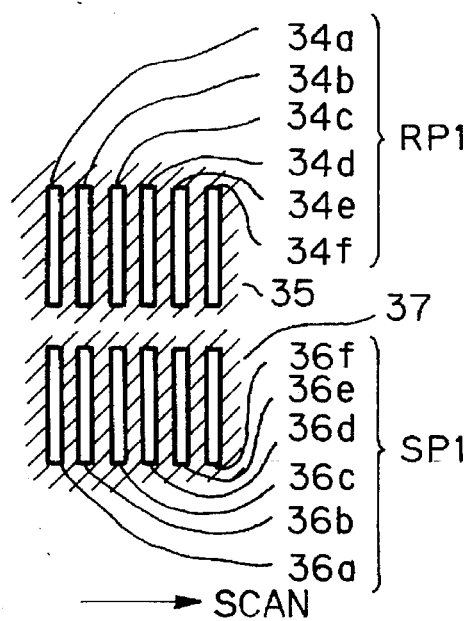
FIGS. 4(a) and 4(b) are enlarged plan views showing a reticle pattern RP1 and a sensor pattern SP1, respectively.
Figure 4B:
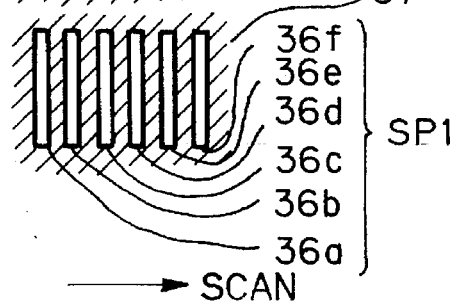

FIGS. 4(a) and 4(b) show another example of the combination of a reticle pattern and a sensor pattern. FIG. 4(a) shows a reticle pattern, and FIG. 4(b) shows a sensor pattern. Referring to FIG. 4(a), the reticle pattern RP1 comprises a plurality of slit-shaped light-transmitting portions 34a to 34f which are arranged in a light-blocking area 35 at equal spaces in the scan direction and elongate in a direction perpendicular to the scan direction. As shown in FIG. 4(b), the sensor pattern SP1 also comprises a plurality of slit-shaped light-transmitting portions 36a to 36f which are arranged in a light-blocking area 37 at equal spaces in the scan direction and elongate in a direction perpendicular to the scan direction.

In this example, both the reticle pattern RP1 and the sensor pattern SP1 comprise a plurality of light-transmitting portions in order to improve the SN ratio. In this case, however, the number of light-transmitting portions of the reticle and sensor patterns RP1 and SP1 which overlap each other differs according to the position in the direction X, and hence the quantity of light entering the photoelectric sensor PES varies. Therefore, it is necessary to correct the measured data for the variation of the light quantity.

FIGS. 5(a) and 5(b) show still another example of the combination of a reticle pattern and a sensor pattern. FIG. 5(a) shows a reticle pattern, and FIG. 5(b) shows a sensor pattern. Referring to FIG. 5(a), the reticle pattern RP2 comprises a plurality of slit-shaped light transmitting portions 38a to 38f which are arranged in a light-blocking area 39 at equal spaces in the scan direction and elongate in a direction perpendicular to the scan direction. As shown in FIG. 5(b), the sensor pattern SP2 comprises a light-transmitting portion 40 of a rectangular cut portion which is formed in a light-blocking area 41, and which has approximately the same width in a direction perpendicular to the scan direction as that of one of the projected images of the slit-shaped light-transmitting portions constituting the reticle pattern RP2, and further has a straight-line edge 42 at an end thereof in the scan direction. The width in the scan direction of the light-transmitting portion 40 is sufficiently wider than the width in the scan direction of the projected image of the reticle pattern RP2.

In this method, the edge 42 of the sensor pattern SP2 is utilized. If the sensor pattern SP2 is scanned in the direction X using the reticle pattern RP2 and the sensor pattern SP2, the quantity of light entering the photoelectric sensor PES is measured as being an integrated quantity. This will be explained below with reference to FIGS. 8(a) and 8(b).

Figure 8A:
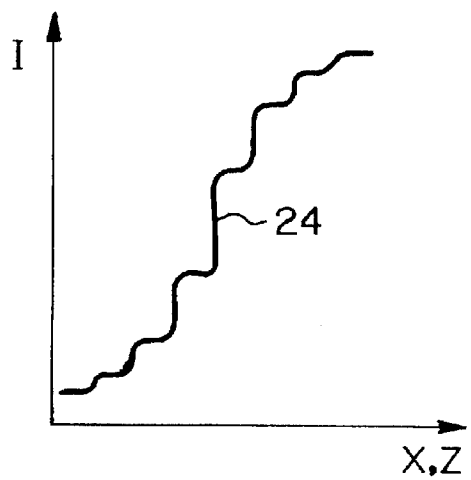
FIGS. 8(a) and 8(b) are graphs each showing the waveform of an output signal from the photoelectric sensor obtained by using the reticle and sensor patterns shown in FIGS. 5(a) and 5(b).
Figure 8B:
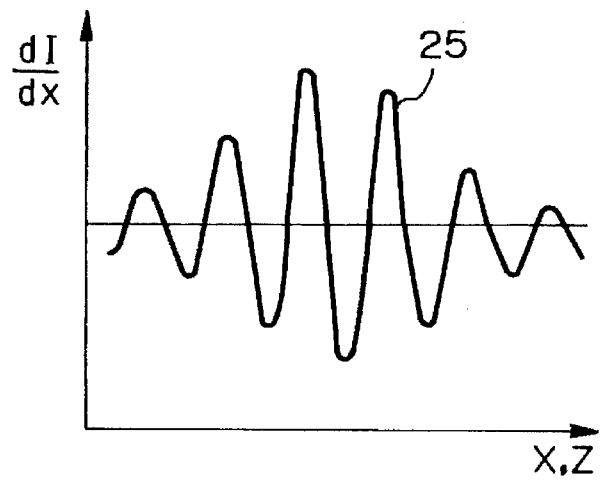

FIG. 8(a) shows the waveform of the output signal I from the photoelectric sensor PES, and FIG. 8(b) shows the waveform of a signal dI/dx obtained by differentiating the output signal I shown in FIG. 8(a) with respect to the position x in the direction X. It should be noted that, in FIGS. 8(a) and 8(b), the abscissa axis represents the position z in the direction Z and the position x in the direction X. The curve 24 in FIG. 8(a) shows the output signal I from the photoelectric sensor PES. As the wafer stage WS moves, the output signal I shown by the curve 24 stepwisely increases, and as the wafer stage WS approaches the focus position, the difference in height between a pair of adjacent steps increases, whereas, as the wafer stage WS comes away from the focus position, the height difference decreases and converges to zero.

That is, since the photoelectric sensor PES outputs a signal in such a form that a waveform equivalent to the curve 21 in FIG. 2 is integrated, the signal must be differentiated to obtain an output signal equivalent to the curve 21 in FIG. 2. The curve 25 in FIG. 8(b) is obtained by differentiating the curve 24 in FIG. 8(a) with respect to the position x of the wafer stage WS. Thus, an output signal equivalent to the curve 21 in FIG. 2 is obtained. Accordingly, a focus position is calculated by a method similar to that described in connection with FIG. 2, and the wafer stage WS is moved to the focus position in the direction Z. More specifically, in a case where the sensor pattern SP2 shown in FIG. 5(b) is used, the focus position detecting system 9 differentiates the output signal from the photoelectric sensor PES, statistically processes the differential signal in the same way as in the above-described embodiment to obtain approximate functions expressing envelopes, and calculates a focus position BF on the basis of the approximate functions. It should be noted that the differential signal may be obtained in the focus position detecting system 9 in a software manner or by using a differentiating circuit.

According to the method of this example, reticle patterns having various line widths can be measured with the configuration of the sensor pattern SP kept constant, and the sensor pattern SP can be readily formed, advantageously, although the arithmetic processing becomes somewhat complicated.

FIGS. 6(a) and 6(b) show a further example of the combination of a reticle pattern and a sensor pattern. FIG. 6(a) shows a reticle pattern, and FIG. 6(b) shows a sensor pattern. Referring to FIG. 6(a), the reticle pattern RP3 comprises a single slit-shaped light-transmitting portion 43 which is formed in a light-blocking area 44 and elongate in a direction perpendicular to the scan direction. As shown in FIG. 6(b), the sensor pattern SP3 also comprises a single slit-shaped light-transmitting portion 45 which is formed in a light-blocking area 46 and elongate in a direction perpendicular to the scan direction.

The feature of this example resides in the method of scanning the wafer stage WS. That is, while being reciprocatively moved in the direction X, the wafer stage WS is continuously moved in the direction Z to thereby obtain a waveform equivalent to the curve 21 shown in FIG. 2.

FIGS. 7(a) and 7(b) show a still further example of the combination of a reticle pattern and a sensor pattern. FIG. 7(a) shows a reticle pattern, and FIG. 7(b) shows a sensor pattern. Referring to FIG. 7(a), the reticle pattern RP4 comprises a single slit-shaped light-transmitting portion 47 which is formed in a light-blocking area 48 and elongate in a direction perpendicular to the scan direction. As shown in FIG. 7(b), the sensor pattern SP4 comprises a plurality of slit-shaped light-transmitting portions 49a to 49f which are arranged in a light-blocking area 50 at equal spaces in the scan direction and elongate in a direction perpendicular to the scan direction. In this example, the combination of reticle and sensor patterns is in reverse relation to that shown in FIGS. 3(a) and 3(b).

Although in the above-described examples the sensor pattern SP is moved in the directions X and Z, the same result can be obtained by moving the reticle pattern RP instead. It is also possible to move both the reticle pattern RP and the sensor pattern SP. In such a case, for example, while the reticle pattern RP is being moved in the direction X, the sensor pattern SP is moved in the direction Z. It is also possible to effect scanning by moving the reticle pattern RP or the sensor pattern SP in the three directions X, Y and Z at the same time.

Thus, the focus detecting method according to the described embodiment enables a focus position to be detected in a reduced period of time without requiring strict positioning accuracy. A projection exposure apparatus or other similar apparatus is provided with a mechanism which measures an atmospheric pressure change and a temperature change, calculates a change of the focus position on the basis of parameters previously obtained, and automatically adjusts the angle of a plane-parallel plate of a light-receiving system in an oblique incidence optical system so that the system will not shift from the focus position, as shown in U.S. Pat. No. 4,687,322. The projection exposure apparatus is further provided with a function whereby a change of the focus position caused by absorption of exposure light by a projection optical system of the apparatus is calculated on the basis of the energy quantity of exposure light entering the projection optical system, as shown in U.S. Pat. No. 4,801,977.

However, these functions are based on predictive calculation, and hence cannot cope with a factor which cannot be predicted. Therefore, if the functions are combined with the method of detecting a focus position by actual measurement according to the above-described embodiment to thereby compensate for the shortcomings of the functions, the advantageous effects of the functions can be exhibited even more favorably. Particularly, a change of the focus position caused by absorption of exposure light is a relatively rapid change, unlike the change in the atmospheric pressure, and therefore, the detection of a focus position must be carried out frequently (e.g., every 10 minutes). However, the method of the above-described embodiment enables a focus position to be detected at high speed. Accordingly, by using the focus position detecting method in combination with the projection exposure apparatus, it is possible to improve not only the throughput of the exposure process but also the accuracy in the entire apparatus.

Although in the above-described embodiment illumination is effected from above the reticle R, the present invention is not necessarily limited thereto. For example, the arrangement may be such that illuminating light for exposure is led into the wafer stage WS through a light guide so as to illuminate the sensor pattern SP from below it, and light passing through the sensor pattern SP is passed through the projection optical system PL to illuminate the reticle pattern RP and received at the upper side thereof. The arrangement may also be such that a reflecting pattern is used as the reticle pattern RP, and reflected light from the reticle pattern RP is received by a photoelectric sensor through the projection optical system PL, the sensor pattern SP, and a beam splitter (not shown).

It should be noted that the focus detecting method of the present invention may be applied not only to a step-and-repeat exposure apparatus but also to a step-and-scan exposure apparatus in which exposure is carried out with the reticle and the wafer being scanned relative to each other, without a need of change.

Thus, the present invention is not necessarily limited to the above-described embodiment, but may adopt various arrangements without departing from the gist of the present invention.

According to the focus detecting method of the present invention, an imagery position (focus position) of a projection optical system can be detected simply by scanning a pattern for detection and a light-receiving part relative to each other once in two directions. Therefore, it is possible to detect a focus position with high accuracy in a short time without requiring strict alignment. Accordingly, if the focus detecting method is applied to an exposure apparatus, the throughput is advantageously improved. The focus detecting method is particularly useful in a case where the focus position of the projection optical system varies with a change in exposure conditions or illuminating conditions, and the focus position must be frequently measured.

In a case where either the pattern for detection or the light-receiving part of the photoelectric detector is moved parallel to the optical axis, and at the same time, the other of the two is moved in a direction perpendicular to the optical axis, the control of the stage system is facilitated, and the structure of the stage system can be advantageously simplified.

In a case where the pattern for detection is one or a plurality of slit-shaped patterns arranged in a predetermined direction, and the light-receiving part of the photoelectric detector, which corresponds to the above pattern for detection, is a pattern having an edge which extends in a direction perpendicular to the predetermined direction, the light-receiving area of the light-receiving part can be enlarged, and it is therefore unnecessary to change the pattern configuration of the light-receiving part of the photoelectric detector according to the measurement line width of the pattern for detection. Moreover, it is easy to form a pattern constituting the light-receiving part; this is another advantage of the present invention.

Further, in a case where the projection optical system is used to project an image of a mask pattern illuminated by an illumination optical system onto a photosensitive substrate, and the pattern for detection is disposed at the mask pattern side and illuminated by the illumination optical system, there is no need for providing a special illumination system for the detection of a focus position.

What is claimed is:

1. A method of detecting a focus position of a projection optical system which projects an image of a pattern on a first surface onto a second surface, said method comprising the steps of:

employing a pattern for detection which is disposed on one of said first and second surfaces, and a photoelectric detector having a light-receiving part of predetermined configuration, said light-receiving part being disposed on the other of said first and second surfaces;

illuminating said pattern for detection;

moving said pattern for detection and said light-receiving part relative to each other in a direction parallel to an optical axis of said projection optical system, and at the same time, moving said pattern for detection and said light-receiving part relative to each other in a direction perpendicular to said optical axis, and further taking in an output signal from said photoelectric detector when said light-receiving part crosses a bundle of light rays forming an image of said pattern for detection; and obtaining a focus position of said projection optical system on the basis of said output signal taken in.

2. A method according to claim 1, wherein said pattern for detection comprises one or a plurality of slit-shaped patterns arranged in a predetermined direction, and the light-receiving part of said photoelectric detector has an edge extending in a direction perpendicular to said predetermined direction.

3. A method according to claim 2, wherein said pattern for detection comprises a plurality of slit-shaped patterns, and the light-receiving part of said photoelectric detector comprises a single slit having said edge.

4. A method according to claim 2, wherein said pattern for detection comprises a plurality of slit-shaped patterns, and the light-receiving part of said photoelectric detector comprises a plurality of slit-shaped patterns arranged in said predetermined direction and each having said edge.

5. A method according to claim 2, wherein said pattern for detection comprises a plurality of slit-shaped patterns, and the light-receiving part of said photoelectric detector comprises a rectangular cut portion having said edge and a sufficiently larger width in said predetermined direction than that of each of said slit-shaped patterns for detection.

6. A method according to claim 2, wherein said pattern for detection comprises a single slit, and the light-receiving part of said photoelectric detector comprises a single slit having said edge, and wherein either said pattern for detection or the light-receiving portion of said photoelectric detector is reciprocatively moved parallel to said optical axis, and at the same time, the other of said two is moved in a direction perpendicular to said optical axis.

7. A method according to claim 2, wherein said pattern for detection comprises a single slit, and the light-receiving part of said photoelectric detector comprises a plurality of slit-shaped patterns arranged in said predetermined direction and each having said edge.

8. A method according to claim 2, wherein a space between said plurality of patterns for detection is close to a resolution of said projection optical system.

9. A method according to claim 1, wherein a speed of relative movement of said pattern for detection and the light-receiving part of said photoelectric detector in a direction perpendicular to said optical axis is slowed down in front of and behind a position which is predicted to be a focus position of said projection optical system.

10. A method according to claim 1, wherein said projection optical system is used to project an image of a mask pattern illuminated by an illumination optical system onto a photosensitive substrate, and said pattern for detection is disposed at said mask pattern side and illuminated by said illumination optical system.

11. A method according to claim 10, wherein a plurality of said patterns for detection are provided on said mask, and wherein an average image surface is obtained on the basis of results of measurement carried out by said method at a plurality of points in an entire exposure area on said mask, and said photosensitive substrate is controlled so that a surface of said photosensitive substrate coincides with said average image surface.

12. A method according to claim 1, wherein either said pattern for detection or the light-receiving part of said photoelectric detector is moved parallel to said optical axis, and at the same time, the other of said two is moved in a direction perpendicular to said optical axis.

13. A method according to claim 12, wherein said pattern for detection comprises one or a plurality of slit-shaped patterns arranged in a predetermined direction, and the light-receiving part of said photoelectric detector has an edge extending in a direction perpendicular to said predetermined direction.

14. A method according to claim 1, wherein said pattern for detection comprises one or a plurality of elongate reflecting patterns arranged in a predetermined direction, and wherein reflected light from said pattern for detection is received by said photoelectric detector through said projection optical system.

15. A method according to claim 1, wherein measurement by said method is carried out a plurality of times, and an average of measured data is determined to obtain a focus position.

16. A method of detecting a focus position of a projection optical system which projects an image of a pattern on a first surface onto a second surface, said method comprising the steps of:

illuminating a pattern for detection which is disposed on either one of said first and second surfaces, and moving an image of said pattern for detection and a light-receiving part of a photoelectric detector relative to each other in a direction of an optical axis of said projection optical system and also in a direction perpendicular to said optical axis, said light-receiving part being disposed on the other of said first and second surfaces;

wherein said pattern for detection comprises a plurality of bar patterns, and said light-receiving part comprises an opening which has an edge approximately parallel to images of said bar patterns, and which has a width larger than a width of one of the images in a direction perpendicular to said edge; and differentiating a signal which is outputted from said photoelectric detector as said movement progresses, and detecting a focus position of said projection optical system on the basis of the differentiated signal.

17. A projection exposure apparatus comprising:

a projection optical system for projecting an image of a pattern on a mask onto a substrate;

an illumination system for illuminating a pattern for detection which is disposed at an object surface side of said projection optical system, said pattern comprising a plurality of bar patterns;

a photoelectric detector having a light-receiving part which is disposed at an image surface side of said projection optical system, said light-receiving part comprising an opening which has an edge approximately parallel to images of said plurality of bar patterns, and which has a width larger than a width of one of the images in a direction perpendicular to said edge;

a device for moving an image of said pattern for detection and said light-receiving part relative to each other in a direction of an optical axis of said projection optical system and also in a direction perpendicular to said optical axis; and a device for differentiating a signal which is outputted from said photoelectric detector as said movement progresses, and for detecting a focus position of said projection optical system on the basis of the differentiated signal.

18. An apparatus according to claim 17, wherein said pattern for detection is formed on said mask, and said illumination system is an illumination optical system which illuminates said mask with exposure light.

19. An apparatus according to claim 17, further comprising:

a stage movable in said optical axis direction and also in a direction perpendicular to said optical axis with said substrate held thereon;

said light-receiving part being provided on said stage, and said moving device having a system for driving said stage.

* * * * *